United States Patent
Coyle et al.

(10) Patent No.: US 8,039,956 B2
(45) Date of Patent: Oct. 18, 2011

(54) HIGH CURRENT SEMICONDUCTOR DEVICE SYSTEM HAVING LOW RESISTANCE AND INDUCTANCE

(75) Inventors: Anthony L. Coyle, Plano, TX (US); Bernhard P. Lange, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 665 days.

(21) Appl. No.: 11/210,066

(22) Filed: Aug. 22, 2005

(65) Prior Publication Data
US 2007/0040237 A1   Feb. 22, 2007

(51) Int. Cl.
*H01L 29/40* (2006.01)
(52) U.S. Cl. .......................... 257/737; 257/738; 257/780
(58) Field of Classification Search .................. 257/737, 257/738, 780
See application file for complete search history.

(56) References Cited

U.S. PATENT DOCUMENTS

| | | | |
|---|---|---|---|
| 6,169,329 B1 * | 1/2001 | Farnworth et al. | 257/780 |
| 6,510,976 B2 * | 1/2003 | Hwee et al. | 228/180.22 |
| 6,550,666 B2 | 4/2003 | Chew et al. | |
| 6,759,738 B1 * | 7/2004 | Fallon et al. | 257/690 |
| 6,768,210 B2 * | 7/2004 | Zuniga-Ortiz et al. | 257/781 |
| 7,122,897 B2 * | 10/2006 | Aiba et al. | 257/738 |
| 2004/0089946 A1 * | 5/2004 | Wen | 257/737 |

* cited by examiner

Primary Examiner — Samuel Gebremariam
(74) Attorney, Agent, or Firm — Yingsheng Tung; Wade J. Brady, III; Frederick J. Telecky, Jr.

(57) ABSTRACT

A high current semiconductor device (for example QFN for 30 to 70 A) with low resistance and low inductance is encapsulated by molding compound (401, height 402 about 0.9 mm) so that the second lead surfaces 110b remain un-encapsulated. A copper heat slug (404) may be attached to chip surface (101b) using thermally conductive adhesive (403). Chip surface (101a), protected by an overcoat (103) has metallization traces (102). Copper-filled windows (107) contact the traces and copper layers (105) parallel to traces (102). Copper bumps (108) are formed on each line in an orderly and repetitive arrangement so that the bumps of one line are positioned about midway between the bumps of the neighboring lines. A substrate has elongated leads (110) oriented at right angles to the lines; the leads connect the corresponding bumps of alternating lines.

12 Claims, 3 Drawing Sheets

HIGH CURRENT SEMICONDUCTOR DEVICE SYSTEM HAVING LOW RESISTANCE AND INDUCTANCE

FIELD OF THE INVENTION

The present invention is related in general to the field of semiconductor devices and processes and more specifically to high performance flip-chip semiconductor devices, which have low electrical resistance and can provide high power, low noise, and high speed.

DESCRIPTION OF THE RELATED ART

Among the ongoing trends in integrated circuit (IC) technology are the drives towards higher integration, shrinking component feature sizes, and higher speed. In addition, there is the relentless pressure to keep the cost/performance ratio under control, which translates often into the drive for lower cost solutions. Higher levels of integration include the need for higher numbers of signal lines and power lines, yet smaller feature sizes make it more and more difficult to preserve clean signals without mutual interference.

These trends and requirements do not only dominate the semiconductor chips, which incorporate the ICs, but also the packages, which house and protect the IC chips.

Compared to the traditional wire bonding assembly, the growing popularity of flip-chip assembly in the fabrication process flow of silicon integrated circuit (IC) devices is driven by several facts. First, the electrical performance of the semiconductor devices can commonly be improved when the parasitic inductances correlated with conventional wire bonding interconnection techniques are reduced. Second, flip-chip assembly often provides higher interconnection densities between chip and package than wire bonding. Third, in many designs flip-chip assembly consumes less silicon "real estate" than wire bonding, and thus helps to conserve silicon area and reduce device cost. And fourth, the fabrication cost can often be reduced, when concurrent gang-bonding techniques are employed rather than consecutive individual bonding steps.

The standard method of ball bonding in the fabrication process uses solder balls, or bumps, and their reflow technique. These interconnection approaches are more expensive than wire bonding. In addition, there are severe reliability problems in some stress and life tests of solder ball attached devices. Product managers demand the higher the higher performance of flip-chip assembled products, but they also demand the lower cost and higher reliability of wire bonded devices.

SUMMARY OF THE INVENTION

Applicants recognize a need to develop a technical approach which considers the complete system consisting of semiconductor chip—device package—external board, in order to provide superior product characteristics, including low electrical resistance and inductance, high reliability, and low cost. Minimum inductance and noise is the prerequisite of high speed, and reduced resistance is the prerequisite of high power. The system-wide method of assembling should also provide mechanical stability and high product reliability, especially in accelerated stress tests (temperature cycling, drop test, etc.). The fabrication method should be flexible enough to be applied for different semiconductor product families, including substrates and boards, and a wide spectrum of design and process variations.

One embodiment of the invention is a high current semiconductor device with low resistance and low inductance. The chip has an active surface with metallization traces; the active chip surface is protected by an insulating overcoat. Windows in the overcoat expose portions of the metallization traces; the windows are filled with copper to form contacts to the metallization. A copper layer on the overcoat forms lines parallel to the traces under the overcoat; the layers are in contact with the metal-filled windows. Copper bumps are formed on each line in an orderly and repetitive arrangement so that the bumps of one line are located about midway between the bumps of the neighboring lines. A substrate with first and second surfaces has elongated copper leads; the leads are oriented at right angles to the lines. The first surface of each lead is connecting the corresponding bumps of alternating lines, using solder elements. Molding compound encapsulates the assembled device and the substrate so that the leads of the second substrate surface remain exposed.

In some devices, the substrate is a copper leadframe, in others a tape-like or bulk insulator. In other devices, a heat slug is attached to the chip to help cooling the high power device. The copper layer has a thickness between about 10 and 15 µm, and the copper bumps have a height between about 30 and 70 µm. Devices according to the invention may be less than 1 mm thick; their low electrical resistance allows them to handle currents between 15 and 30 A, some devices aim at 60 A and higher. The low inductance provides low electrical noise.

Another embodiment of the invention is a high current electronic system with low resistance and low inductance. The system uses the semiconductor device described above and employs a circuit board with copper contact pads parallel to the copper substrate leads of the device. The exposed surface of the leads is attached to the board pads by a solder layer.

The technical advantages represented by certain embodiments of the invention will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
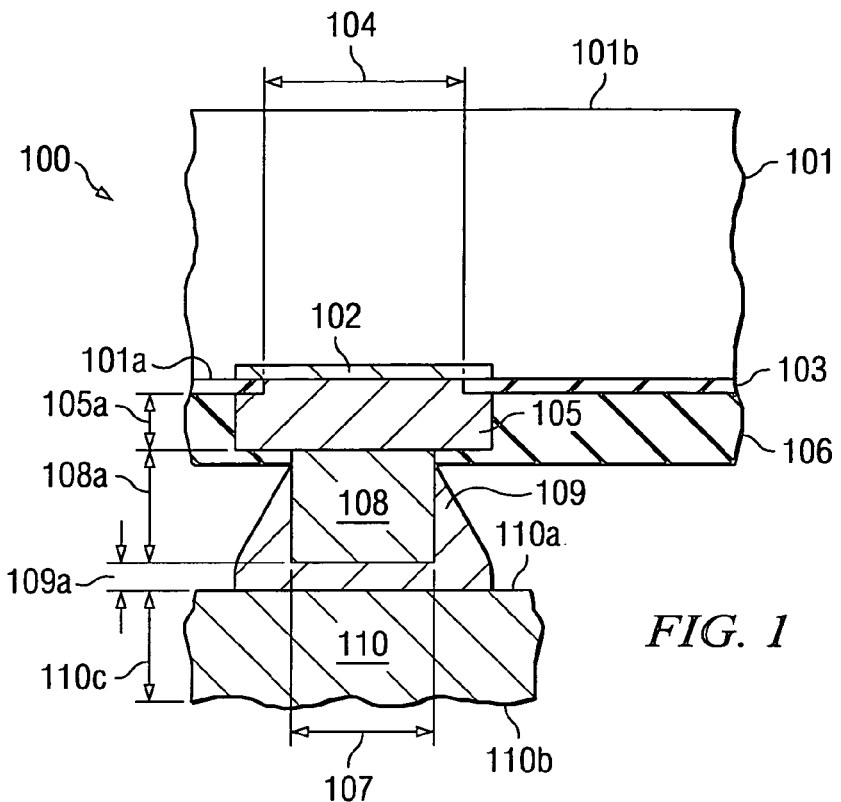
FIG. 1 is a schematic cross section of a portion of an un-encapsulated semiconductor device according to the invention.

FIG. 1 shows schematically a high current semiconductor device, generally designated 100, which has low electrical resistance and low inductance. Based on these features, some embodiments can handle about 15 to 30 A, other embodiments up to 60 A and higher. Semiconductor chip 101 has an active surface 101a, and a surface 101b opposite to the active surface. Chip 101 contains a plurality of metallization levels. The metal level closest to surface 101a is configured into traces; in FIG. 1, one of the traces is designated 102; it is running perpendicular to the paper. Trace 102 may consist of aluminum, aluminum alloy, copper, or copper alloy; the thickness of trace 102 is preferably between about 0.5 and 1.0 μm. The whole active surface 101a is covered with an insulating overcoat 103, preferably in the thickness range between about 0.5 to 1.0 μm. The material for overcoat 103 is preferably selected from a group consisting of silicon nitride, silicon oxynitride, silicon oxide, a stack of two of these compounds, or other mechanically strong and moisture resistant materials.

Along metal trace 102 are a plurality of windows in overcoat 103. FIG. 1 illustrates a window of width 104. These windows expose portions of metallization trace 102. As FIG. 1 indicates, the windows such as 104 are filled with copper to the height of overcoat 103 in order to make electrical contact to metallization 102.

On overcoat 103, and thus also on windows 104, is a copper/copper alloy layer, which is structured into lines 105 running parallel to the traces 102 under the overcoat 103. Lines 105 have a thickness 105a between about 10 and 15 μm. Lines 105 make contact to the copper-filled windows 104. All lines 105 are embedded in a layer 106, which is preferably made of polyimide or similar polymer compound, preferably between 10 to 20μ thick.

At regular intervals along each line 105 are windows of width 107 in polyimide layer 106. The windows 107 of a particular line 105 are selected so that they are located about midway between the intervals of the windows of the neighboring line on each side. Copper/copper alloy bumps 108 fill the windows 107 and make contact to copper line 105. Bumps 108 have a height 108a preferably between about 30 and 70 μm, and a solderable surface. With this pattern, the copper bumps 108 are on each copper line 105 at regular intervals; the bumps of one particular line are located about midway in the interval of the bumps of the neighboring line on each side. Using this alternating sequence, two pluralities of bumps are created, wherein the bump locations of one plurality alternate with the bump locations of the other plurality in a predetermined rhythm.

The device further includes a substrate with elongated copper leads. The embodiment of FIG. 1 illustrates a lead 110, which has first surface 110a and second surface 110b. As an example, the substrate with lead 110 may be a metallic leadframe with elongated leads, or a tape-like or bulk insulator including elongated copper leads. In the example of a metallic leadframe, the copper leads have typically a thickness 110c between 150 and 250 μm.

Leads 110 are oriented at right angles to lines 105. Further, the first lead surface 110a is attached to bumps 108 so that lead 110 connects the corresponding bumps of alternating lines. The connection is provided by solder elements 109. Preferably, the thickness 109a of solder element 109 is between approximately 10 and 25 μm; for enhanced electrical conductivity, it is preferred to keep thickness 109a small. As FIG. 1 indicates, solder element 109 may wet at least portion of the side surfaces of bumps 108. Solder element 109 contains tin; for easy wetting and solderability, it may also contain one or more of the metals selected from a group consisting of silver, bismuth, indium, zinc, copper, nickel, antimony, and lead.

Figure 2:
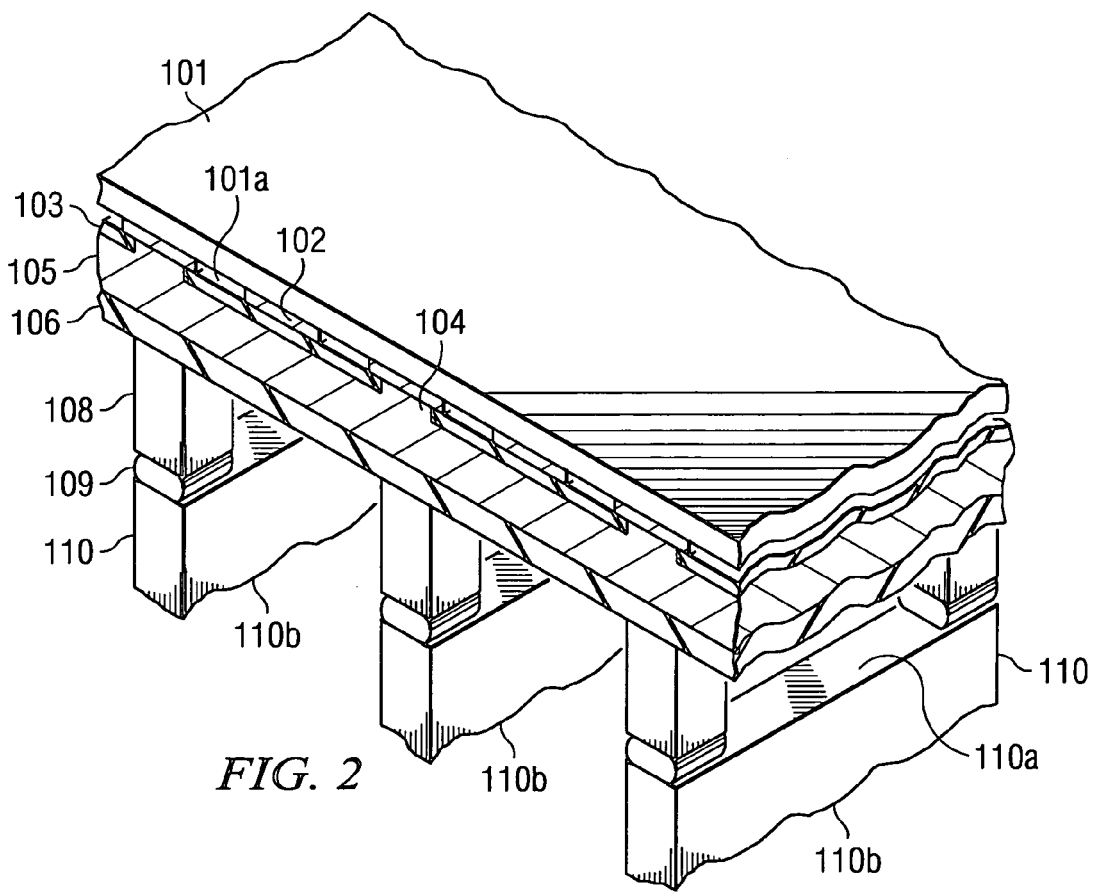
FIG. 2 is a schematic perspective, 3-dimensional view of a portion of a semiconductor device, un-encapsulated, according to the invention.

The relative positioning of copper layer 105, copper bumps 108, and copper leads 110 is illustrated in more detail by the perspective 3-dimensional view of FIG. 2. Equal numbers are employed to refer to equal objects in FIG. 1. The semiconductor chip is designated 101, its active surface 101a, and the protective overcoat over the active surface 103. The surface-nearest metallization is patterned in a plurality of traces 102.

FIG. 2 illustrates that overcoat windows 104, filled with copper, connect alternately to each other metallization trace 102. These alternate copper-filled windows are connected by copper line 105. The insulating polymer layer 106 has openings for copper bumps. Copper bumps 108 are placed on copper line 105 on each location, where the copper-filled windows 104 connect to metallization 102.

Using solder elements 109, bumps 108 are connected to the first surface 110a of substrate leads 110. Leads 110 are oriented at right angles to line 105. The second surface 110b of leads 110 is available for attachment to external parts.

Figure 3:
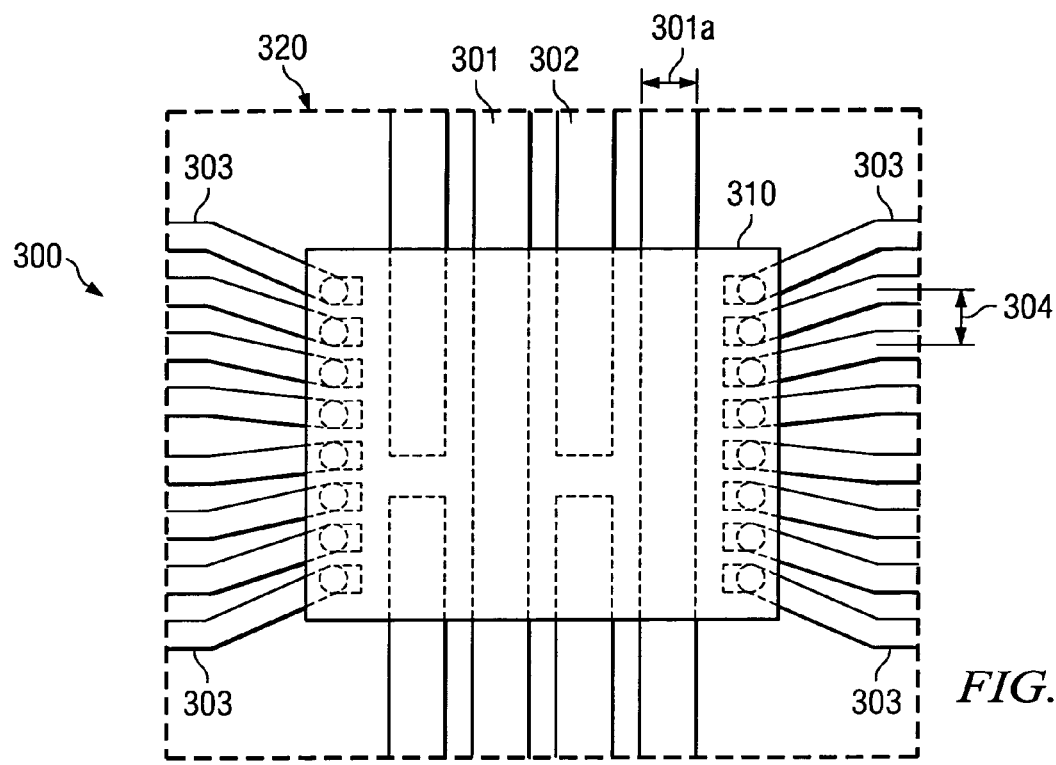
FIG. 3 is a top view of a substrate (leadframe) for use of the device in FIGS. 1 and 2.

As an example of a substrate suitable for a power device capable of handling an electrical current of more than 30 A, FIG. 3 presents the top view of a metallic Quad Flatpack No-Lead (QFN) leadframe, generally designated 300. The leadframe is made of 0.2 mm thick copper. The leads 301 are intended for ground (drain) and have a width 301a of 0.5 mm; the second surface of these leads will remain exposed after the device is encapsulated in order to support the thermal device performance. Alternating with leads 301 are the leads 302, which are intended for power (source), also 0.5 mm wide and also exposed. The device contact pads 303 have a pitch 304 of 0.5 mm. The chip outline 310 has dimensions 3.1×4.0 mm, the device outline 320 has dimensions 6.0×6.0 mm.

The description in FIGS. 1, 2 and 3 of the current path from the chip metallization to the substrate lead highlights that almost all of the metals used are copper, which has excellent electrical conductivity ($0.596 \cdot 10^6$ $\Omega^{-1}$ cm$^{-1}$). Based on the geometries employed in a specific power device, one can calculate the resistance encountered by a current path and compare it with the on-resistance of the active device considered. The calculation shows that for a typical QFN power device under typical operating conditions, the metal resistance contributes between about 15 to 17% of the total resistance, while under the worst case conditions, the metal resistance will not exceed 25% of the total device resistance. Consequently, even small-size QFNs can handle currents in excess of 30 A.

FIGS. 1, 2 and 3 emphasize the shortness of the electrical paths and the relatively large diameter (and high conductivity) of all conductors. These conditions keep not only the electrical resistance low, but also the electrical inductance.

Figure 4:
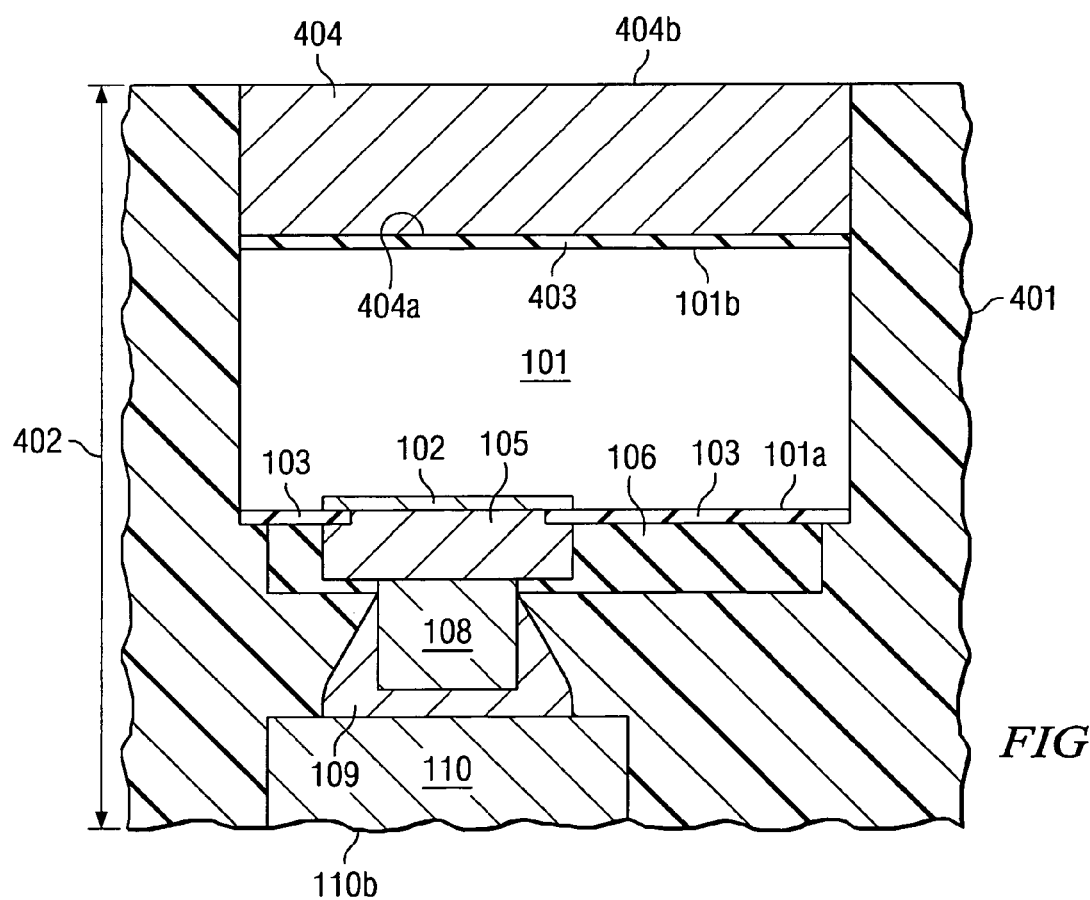
FIG. 4 is a schematic cross section of an encapsulated high current semiconductor device with attached heat slug.

FIG. 4 illustrates the finished power device after encapsulation. Molding compound 401, or another encapsulation material, encapsulates the assembled device and substrate of FIG. 1 so that the second lead surfaces 100b remain unencapsulated and thus available for attachment to the external parts. As an example, for a high power QFN (more than 30 A current), the overall device height 402 may be 0.9 mm.

In one embodiment, the chip surface 101b opposite the active chip surface 101a is covered with molding compound. In another embodiment, a heat slug 404 is attached to chip surface 101b using thermally conductive adhesive 403. In the device of FIG. 4, heat slug 404 has first surface 404a for attachment to chip surface 101b and second surface 404b exposed to the ambient for cooling purposes. In other devices, second slug surface 404b is covered by an amount of encapsulation material. Preferably, a heat slug is made of copper because of its good thermal conductivity (4.01 W·cm$^{-1}$·K$^{-1}$). For additional thermal enhancement, the slug surface facing the ambient may be structured to enhance convection so that the device heat is more effectively transferred to the ambient as the final heat sink; examples include rough slug surface and attached fins or other castellations.

Figure 5:
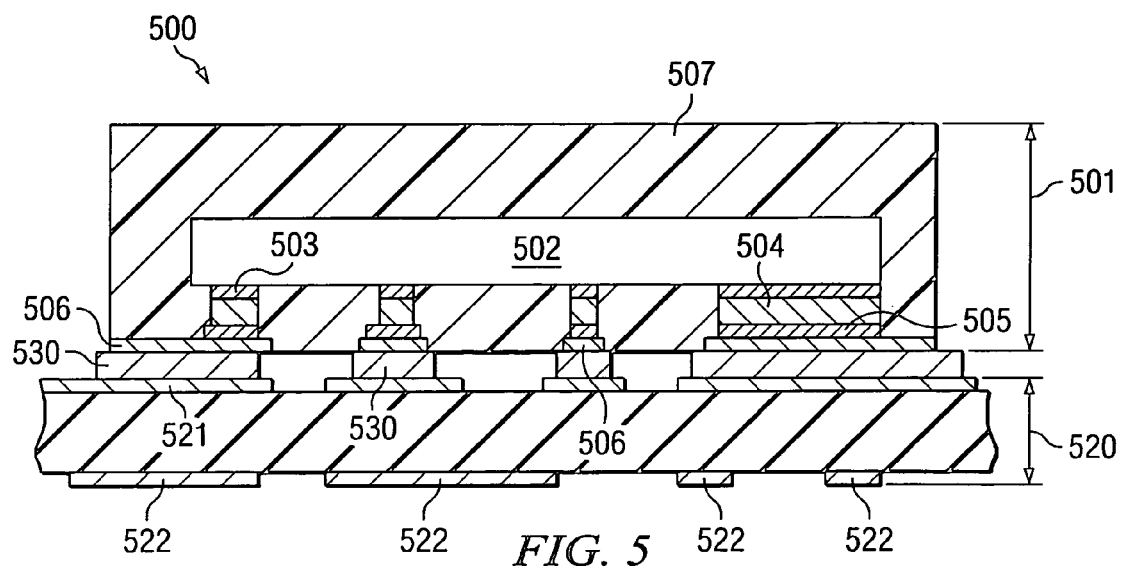
FIG. 5 is a schematic cross section of an encapsulated high current semiconductor device assembled on a circuit board.
Figure 6:
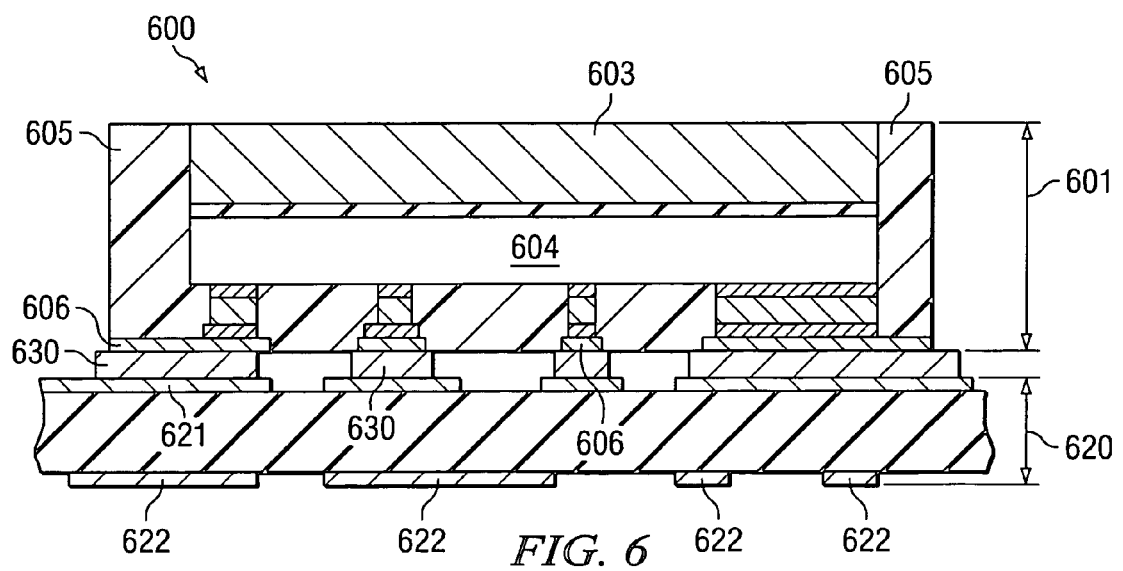
FIG. 6 is a schematic cross section of an encapsulated high current semiconductor device with attached heat slug, assembled on a circuit board.

Another embodiment of the invention, illustrated in FIGS. 5 and 6, is a high current electronic system having low resistance and low inductance. The system includes a semiconductor device soldered by a thin solder layer to a circuit board. In FIG. 5, the system is generally designated 500, the semiconductor device 501, the circuit board 520, and the solder layer 530. The solder layer has preferably a thickness between about 10 and 20 μm.

The semiconductor device comprises chip 502 with metallization traces (nor shown in FIG. 5). The traces are contacted by copper lines 503 parallel to the traces. Each line 503 has copper bumps 504 in an orderly and repetitive arrangement so that the bumps of one line are positioned about midway between the corresponding bumps of the neighboring lines. Using solder elements 505, corresponding bumps of alternating lines are contacted by elongated copper leads 506 of a substrate; the leads 506 are oriented at right angles to the lines 503. Molding compound 507 encapsulates the assembled device and the substrate so that one surface of the leads remains un-encapsulated.

Circuit board 520 has copper contact pads 521 parallel to the leads 506. The un-encapsulated surface of the leads is attached to the board pads 521 by solder layers 530. For low electrical resistance, solder layer 530 is preferably kept thin, since its electrical conductivity is lower than the conductivity of copper. As FIG. 5 indicates, board 520 may have another set of contact pads 522 on its surface opposite to the device attachment surface. These additional set of pads can be employed for pressure or solder contacts to additional external parts.

FIG. 6 depicts a high current electronic system with low resistance and low inductance. The system, generally designated 600, includes a semiconductor device 601 with heat slug 603 attached to the chip 604 and incorporated into the molded package 605, further a circuit board 620. The device is attached to board 620 by solder layer 630.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications.

We claim:

1. A semiconductor device, comprising:
   a chip having an active surface with a first metal trace of a first thickness thereon covered with an insulating overcoat layer;
   a first plurality of windows through the overcoat layer, exposing portions of the first metal trace;
   a first conductive line having a second thickness greater than ten times the first thickness over and paralleling the first metal trace and contacting the first metal trace through the first plurality of windows,
   a first plurality of conductive bumps having a height of the same order as the second thickness contacting the conductive line; and
   a substrate having a first conductive lead over and perpendicular to the first metal trace and the first conductive line connected to at least one of the first plurality of the conductive bumps.

2. The semiconductor device of claim 1, in which the substrate is a leadframe.

3. The semiconductor device of claim 1, in which the first thickness ranges from 0.5 to 1.0 μm.

4. The semiconductor device of claim 1, in which the second thickness ranges from 10 to 15 μm.

5. The semiconductor device of claim 1, further comprising a polymeric layer over a portion of the conductive line.

6. The semiconductor device of claim 5, in which the polymeric layer includes polyimide.

7. The semiconductor device of claim 1, further comprising a plurality of parallel metal traces over the active surface of the semiconductor chip.

8. The semiconductor device of claim 7, further comprising a plurality of parallel conductive lines over and paralleling the plurality of parallel metal traces.

9. The semiconductor device of claim 8, in which the substrate further comprises a plurality of parallel conductive leads.

10. The semiconductor device of claim 9, in which the first plurality of conductive bumps contacting alternating leads of the plurality of parallel conductive leads.

11. The semiconductor device of claim 8, in which each of the plurality of conductive line overlays one of the plurality of metal traces.

12. The semiconductor device of claim 11, in which the plurality of conductive leads are disposed perpendicular to the plurality of metal traces and the conductive lines.

* * * * *